US012640192B2

(12) United States Patent
Chou et al.

(10) Patent No.: US 12,640,192 B2
(45) Date of Patent: May 26, 2026

(54) DUAL RAIL MEMORY DEVICE

(71) Applicant: Taiwan Semiconductor Manufacturing Company, Ltd., Hsinchu (TW)

(72) Inventors: Yen-Chi Chou, Tainan City (TW); Shao Hsuan Hsu, Taoyuan City (TW); Tzu-Chun Lin, New Taipei City (TW); Chien-Yu Huang, Zhongli City (TW); Cheng Hung Lee, Hsinchu (TW); Hung-Jen Liao, Hsin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 104 days.

(21) Appl. No.: 18/400,687

(22) Filed: Dec. 29, 2023

(65) Prior Publication Data

US 2025/0218505 A1     Jul. 3, 2025

(51) Int. Cl.
*G11C 11/418*     (2006.01)
*G11C 11/412*     (2006.01)
*G11C 11/419*     (2006.01)

(52) U.S. Cl.
CPC .......... *G11C 11/418* (2013.01); *G11C 11/412* (2013.01); *G11C 11/419* (2013.01)

(58) Field of Classification Search
CPC .... G11C 11/412; G11C 11/418; G11C 11/419
USPC ........................................................ 365/154
See application file for complete search history.

(56) References Cited

U.S. PATENT DOCUMENTS

| | | | |
|---|---|---|---|
| 7,733,701 B2 | 6/2010 | Kamei | |
| 8,279,659 B2 * | 10/2012 | Cho ....................... | G11C 7/227 |
| | | | 365/194 |
| 8,300,491 B2 | 10/2012 | Tao et al. | |
| 8,315,085 B1 | 11/2012 | Chang et al. | |
| 8,467,257 B1 | 6/2013 | Liu et al. | |
| 8,488,396 B2 | 7/2013 | Lee et al. | |
| 8,630,132 B2 | 1/2014 | Cheng et al. | |
| 8,665,658 B2 | 3/2014 | Chen | |
| 8,934,308 B2 | 1/2015 | Wang | |
| 9,093,126 B2 | 7/2015 | Yang et al. | |

(Continued)

FOREIGN PATENT DOCUMENTS

TW          202338825 A     10/2023

*Primary Examiner* — Sung Il Cho
*Assistant Examiner* — Sung I Cho
(74) *Attorney, Agent, or Firm* — Merchant & Gould P.C.

(57)          ABSTRACT

A memory device has a memory cell operated in a first power domain having a first voltage level. A memory word line is connected to the memory cell, and a memory bit line is connected to the memory cell. A word line decoder circuit is operated in the first power domain, and a word line driver circuit is configured to receive a row address signal from the word line decoder circuit and output a word line enable signal to the memory word line. An IO circuit is connected to the memory bit line, and the IO circuit is operated in a second power domain having a second voltage level lower than the first voltage level. A tracking word line is connected to a tracking cell, and the tracking word line is configured to output a tracking cell enable signal in the first power domain. A tracking bit line is connected to the tracking cell, and the tracking bit line is configured to output a trigger signal in the first power domain to the IO circuit.

20 Claims, 6 Drawing Sheets

(56)                    References Cited

U.S. PATENT DOCUMENTS

| | | |
|---|---|---|
| 9,111,595 B2 | 8/2015 | Hsu et al. |
| 9,324,392 B1 * | 4/2016 | Asenov .................... G11C 8/08 |
| 9,666,253 B2 | 5/2017 | Chang et al. |
| 9,697,890 B1 | 7/2017 | Wang |
| 10,276,232 B2 | 4/2019 | Wu et al. |
| 11,651,804 B2 | 5/2023 | Su et al. |
| 2007/0008771 A1 * | 1/2007 | Lee ........................ G11C 7/227 |
| | | 365/201 |
| 2012/0257464 A1 * | 10/2012 | Moriwaki .............. G11C 7/227 |
| | | 365/189.11 |
| 2014/0025981 A1 * | 1/2014 | Evans ....................... G06F 1/10 |
| | | 713/501 |
| 2014/0269026 A1 * | 9/2014 | Tao ....................... G11C 11/419 |
| | | 365/191 |
| 2018/0130520 A1 * | 5/2018 | Chevallier ............ G11C 11/419 |
| 2019/0147942 A1 * | 5/2019 | Jain ....................... G11C 11/419 |
| | | 365/156 |

* cited by examiner

DUAL RAIL MEMORY DEVICE

BACKGROUND

One type of integrated circuit memory is a static random access memory (SRAM) device. A typical SRAM memory device has an array of memory cells. Each memory cell uses six transistors connected between an upper reference potential and a lower reference potential (typically ground) such that one of two storage nodes can be occupied by the information to be stored, with the complementary information stored at the other storage node. A "dual rail" SRAM architecture refers to an SRAM arrangement where the memory logic is operated in a low voltage domain, while the memory array is operated in the high voltage domain. Due to this, the memory leakage power is reduced significantly but the memory access time is impacted. The gain in leakage power increases as the difference in the high voltage and low voltage value increases. Since the memory array is operated in the high voltage domain, both word line and bit line would preferably be operated in the high voltage domain without impacting the static noise margin and write margin if the logic voltage is decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
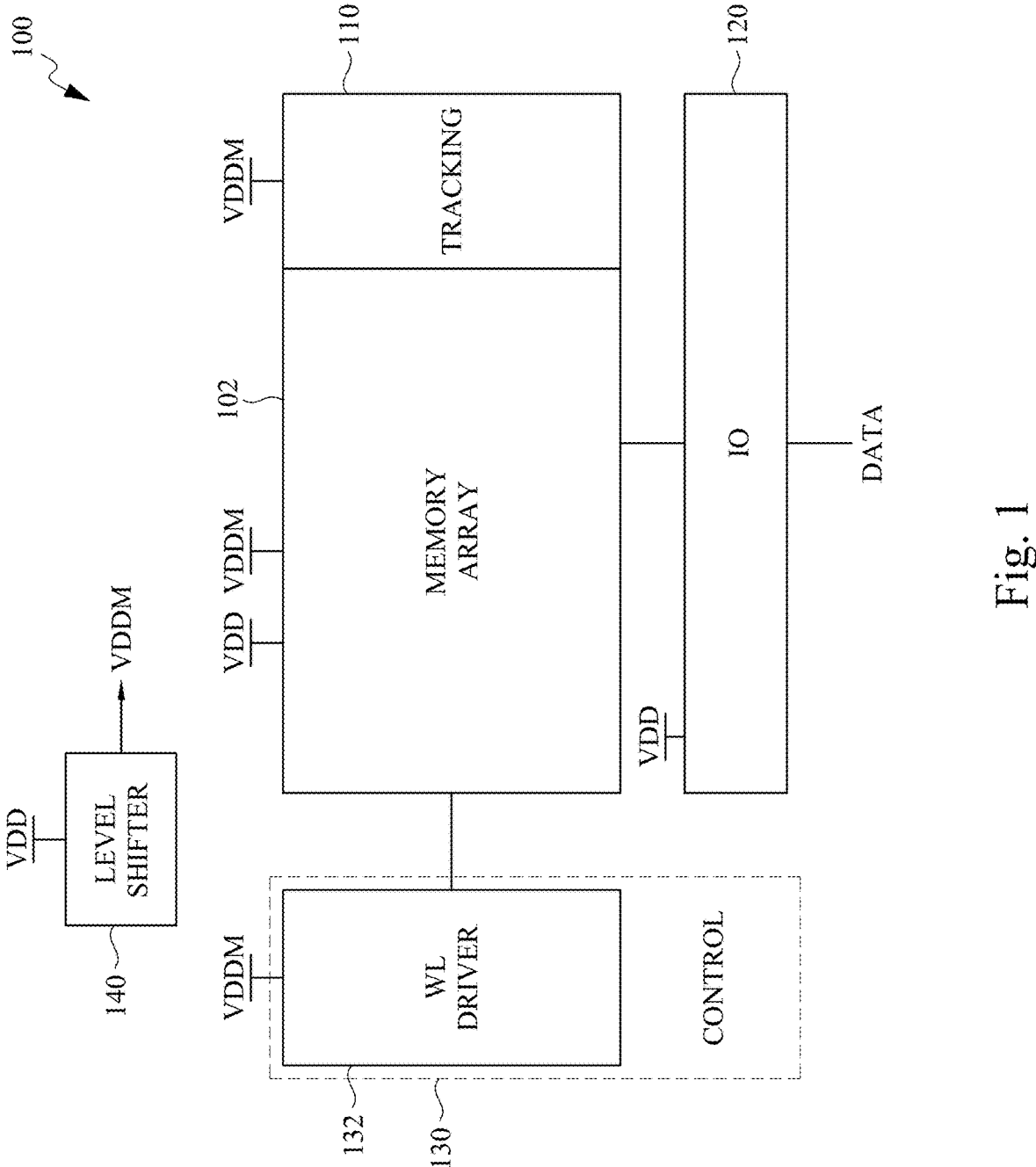
FIG. 1 is a block diagram illustrating aspects of an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device has an array of memory cells that include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines.

As the operational voltages of integrated circuits and an associated memory circuit are reduced, the read and write margins of the memory circuit memory cells and peripheral circuit signals are also reduced. These read margins are a measure of how reliable the data bits of a memory cell can be read from and/or written into. To counteract the effects of reduced read margins, sense amplifiers are used in input/output (IO) circuits to amplify the signal on each cell column within a memory circuit.

A "dual rail" SRAM architecture refers to an SRAM arrangement where the memory peripheral circuits are is operated in a low voltage domain (e.g. VDD), while the memory array is operated in a high voltage domain (e.g. VDDM). Due to this, the memory leakage power is reduced significantly but the memory access time is impacted. The gain in leakage power increases as the difference in the high voltage and low voltage value increases. In some embodiments, VDD is in the range of 0.5V-1.3V, VDDM is in the range of 0.8V-1.5V, and the difference between VDDM and VDD can be in the range of 0.2V-0.6V. However, the voltage ranges for other embodiments are not limited to the above values.

Certain SRAM memory devices (and other semiconductor memories such as dynamic random access memories (DRAMs)), use a self-timed design, in order to generate enough bit line differential voltage values for reliably reading out data from memory cells on the bit lines. With such self-timed memory devices, a bit cell tracking design is applied, where a tracking bit line (TRKBL) is used to model the bit line discharge delay of the accessed bit line and then generate sense amplifier enable (SAE) signals and word line falling edges. The delays detected through the use of tracking signals are used to adjust the timing of the memory control signals to help ensure the read time margin is sufficiently long such that data may be properly read from the memory.

Factors such as Process/Voltage/Temperature (PVT) variations can cause variations in VDD supply voltage levels. With some self-timed designs, the tracking may be too fast for low VDD operation due to different threshold voltages (VT) between logic circuits and the bit lines. Additionally, in some approaches, if the tracking methodology is implemented for low VDD operation, then the tracking may result in too high a read time margin and therefore will not be optimized for normal VDD operation.

Moreover, an SRAM read margin at a low VDD level will be smaller than that at a high VDD due to longer time periods for from issuance of the word line signal to SAE signal generation. As noted above, with a dual-rail memory design, peripheral circuits such as memory control circuits are operated at the lower VDD power domain. As such, a traditional SRAM word line decoder circuit is operated in the VDD power domain, which can result in a smaller read margin in a low VDD situation. Similarly, tracking bit lines are traditionally operated at the VDD level. This can result in variations in tracking bit line trip points related to such variations in VDD supply voltages. Still further, tracking bit line trip point variations associated with PVT variations can cause a delay fluctuation for a tracking bit line trigger circuit, which in turn can result in making the sense amplifiers of the IO circuit fire too early or too late.

FIG. 1 is a block diagram illustrating aspects of an example memory circuit 100 in accordance with disclosed embodiments. The illustrated memory circuit 100 includes a memory cell array 102, a tracking array 110, IO circuitry 120, and control circuitry 130 with a word line driver circuit 132, among other things. The memory cell array 102 stores data in individual memory cells or bit cells, where each cell is capable of storing one bit of memory. The memory cell array 102 cells are addressable by their respective intersection with an individually selectable word line, or row line, corresponding to a row of memory cells, which may be of any suitable length, and an individual column of memory cells, or bit line. A word line is selected and driven by the word line driver circuit 132. The word line driver 132 receives control signals from the control circuitry 130, and in response selects and causes an individually addressed word line to be asserted. Responsive to an asserted word line, data stored within memory cells within the memory cell array 102 that are associated with an asserted word line are gated onto their respective bit lines. The control circuit 130 may also include a column selector, for selecting individual bit lines or ranges of bit lines to be delivered to the IO circuitry 120.

A dual-rail memory has two power supply rails (e.g. VDD and VDDM). Generally, one power supply rail is for the memory cell array and the other is for the peripheral circuitry. In some implementations, portions of the control 130 are in a one power domain (e.g. VDD) corresponding to the peripheral circuitry. However, other portions of the word line driver 132 and controller 130 are supplied by a another, higher power domain (e.g. VDDM), that may also supply the memory cell array 102. As shown in the example of FIG. 1, a level shifter 140 is provided that receives the VDD voltage level for the lower power domain and outputs the higher VDDM voltage level power domain.

Supply voltage fluctuations in may affect the read margins at the IO 120. To compensate for these fluctuations sense amplifiers are employed at the I/O of the memory cell array to improve voltage change sensing. In embodiments, each bit line is associated with an individual sense amplifier. When a word line is activated, the control circuit 130 outputs a trigger signal for enabling the sense amplifiers based on the tracking array 110, which is discussed in further detail below. The tracking array 110 also receives the VDDM power level. In some disclosed embodiments, the IO circuitry 120 is operated at the VDD level.

Figure 2:
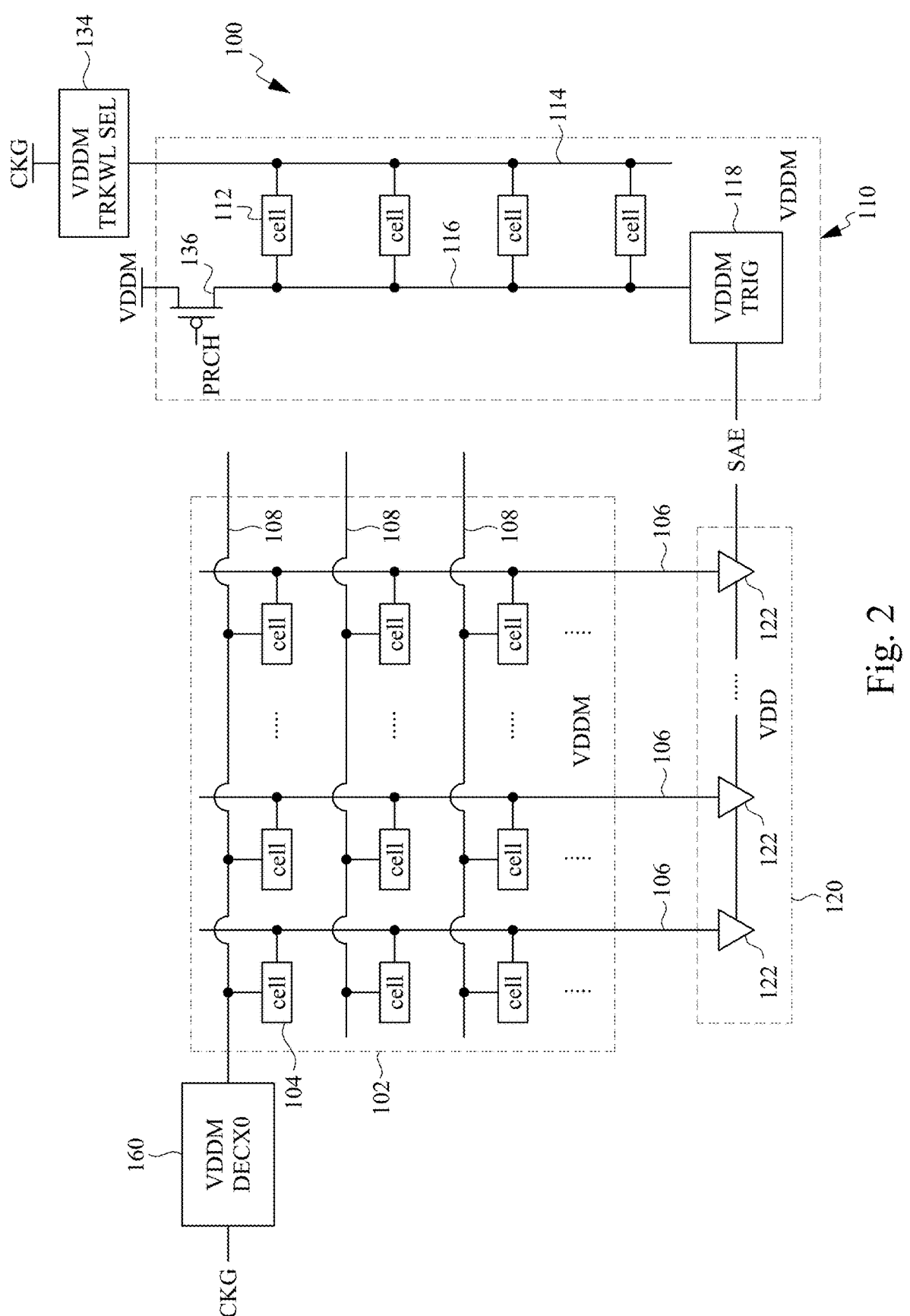
FIG. 2 is a circuit diagram illustrating further aspects of the memory device illustrated in FIG. 1 in accordance with some embodiments.

FIG. 2 illustrates further aspects of the memory circuit 100 in accordance with disclosed embodiments. The memory circuit 100 includes the memory array 102, which has a plurality of memory cells 104. The memory array 102 includes a plurality of columns of bit lines 106, a plurality of rows of word lines 108, wherein the memory cells 104 are situated approximately at a plurality of cross-point locations where the bit lines 106 and the word lines 108 cross through each other but do not physically intersect. The memory array 102 further includes bit line bars, which are omitted from FIG. 2 for the sake of simplicity. The memory cells 104 are coupled to the corresponding bit lines 106 and word lines 108 as shown in FIG. 2. In a read cycle, the differential voltages between the bit lines 106 and the corresponding bit line bars are detected by the IO circuitry 120, which includes a plurality of sense amplifiers 122.

The tracking circuit 110 includes a plurality of tracking cells 112, a tracking bit line 116, a tracking word line 114 and a tracking bit line control or trigger circuit 118. FIG. 2 shows a single column of the tracking array 110 for ease of illustration, though in some examples the tracking array 110 may include a plurality of columns of tracking cells 112. The tracking cells 112 and the tracking bit line 116 simulate the memory cells 104 and the memory bit lines 106 in the memory array 102. The tracking cells 112 are coupled to the tracking bit lines 116 and the tracking word lines 114.

The tracking word line 114 is connected to a tracking word line select circuit 134, which outputs a tracking word line select signal to the tracking word line 114. The tracking bit line 116 is connected to a precharge circuit that, in the illustrated example, includes a precharge transistor 136. The precharge transistor selectively precharges the tracking bit lines 116 to the VDDM voltage level in response to a precharge control signal PRCH CTL, though in other examples the tracking bit lines may be precharged to the lower VDD voltage level. The tracking bit line 116 is further connected to a trigger circuit 119, which is configured to convert a voltage change on the tracking bit line 116 into the SAE signal output to the sense amplifiers 122 of the IO circuit 120. In some embodiments, the tracking signal on the tracking bit line 116 is converted to the SAE signal for controlling the sense amplifiers 122 with a logic delay circuit and generates the SAE signal according to the tracking signal on the tracking bit line 116 plus a delay generated by the logic delay circuit.

Figure 3:
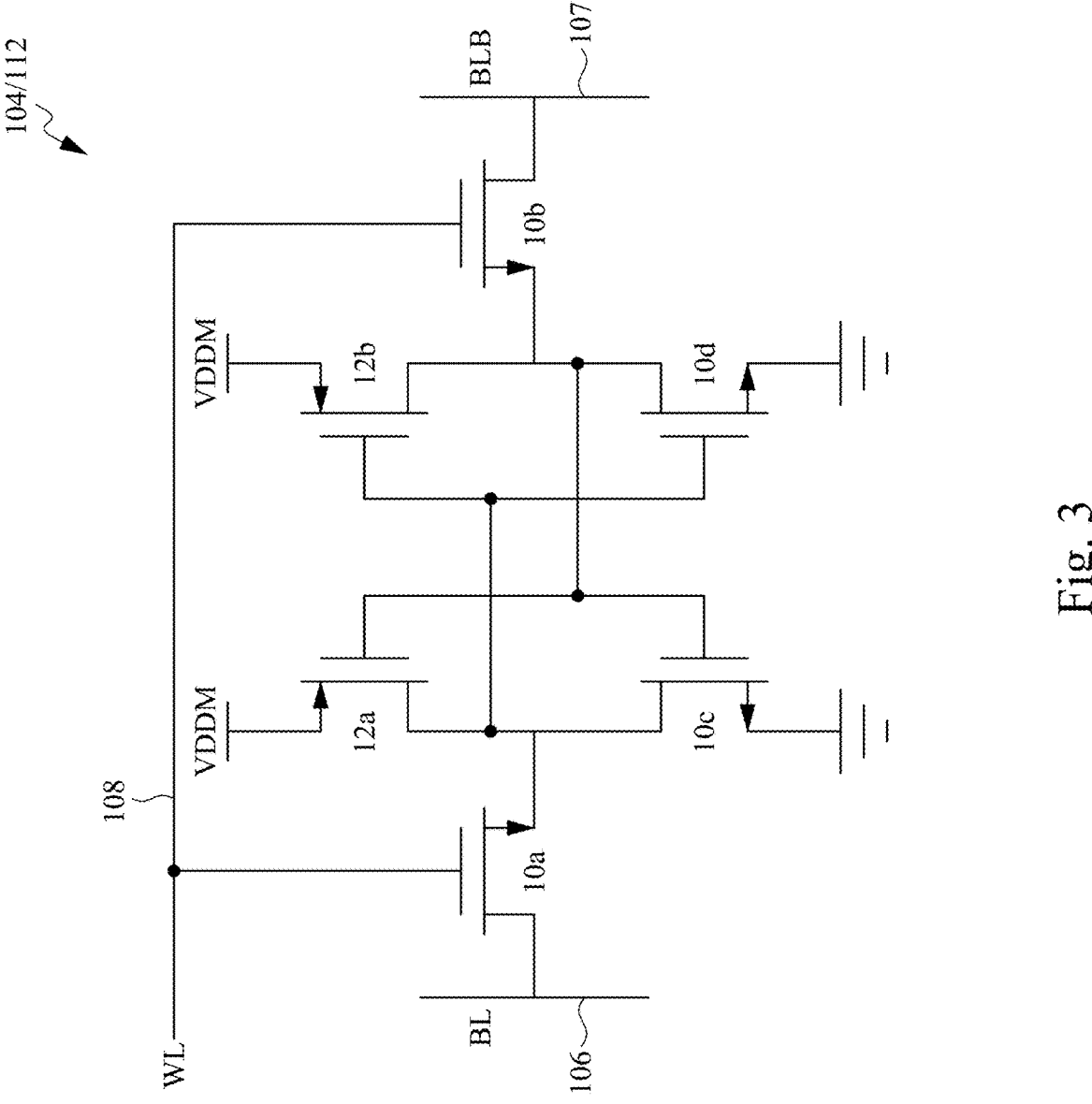
FIG. 3 is a circuit diagram illustrating aspects of an example SRAM device in accordance with some embodiments.

FIG. 3 illustrates an example of an SRAM cell, which implements the memory cells 104 of the memory cell array 102 and the tracking cells 112 of the tracking array 110. As noted above, in the dual-rail memory arrangement, the memory array 110, and thus the SRAM cells 102/112 are operated in the higher power domain VDDM. As such, the SRAM cell 102/112 is connected between VDDM and ground power input terminals.

The SRAM cell 104/112 is connected to the word line WL (i.e. memory word line 108 or tracking word line 114), and the bit lines BL (i.e. memory bit lines 106 or tracking bit lines 116) and bit lines bar 107 (not shown in FIG. 2). The SRAM cell 104/112 includes PMOS transistors 12a-b and NMOS transistors 10a-d. The transistors 12a and 10c are coupled to one another and positioned between the supply voltage VDDM and ground to form an inverter. Similarly, the transistors 12b and 10d are coupled between VDDM and ground to form a second inverter.

The two inverters are cross-coupled to each other. An access or "pass gate" transistor 10a connects the output of the first inverter to the bit line 106/116 in response to a word line enable signal WL output by the word line driver 130 at the VDDM level. Similarly, the access transistor 10*b* connects the output of the second inverter to the bit line bar 107. The word line 108/114 is attached to the gate terminals of the access transistors 10*a* and 10*b* to selectively couple the outputs of the inverters to the bit lines 106/116 during read/write operations in response to the word line driver 130 shown in FIG. 1. During a read operation the inverters drive the complementary voltage levels at the bit lines 106/116.

The cross coupled inverters of the memory cell 104/112 provide two stable voltage states denoting logic values 0 and 1. Metal-Oxide Semiconductor Field Effect Transistors (MOSFETs) are typically used as the transistors in the memory cell 104/112. In some embodiments more or fewer than 6 transistors may be used to implement the memory cell 104/112.

The tracking bit line 116 is precharged to the VDDM voltage level by the precharge transistor 136. In the example of FIG. 2, the precharge transistor 136 is a PMOS transistor having one if its source/drain terminals connected to the VDDM terminal and its other source/drain terminal connected to the tracking bit line 116. Thus, based on the precharge control signal PRCH CTL received at the gate terminal of the precharge transistor 136, the precharge bit line 116 is precharged to the VDDM voltage level. If the tracking bit line 116 were precharged to the low power domain VDD voltage level, the bit line trip point is smaller at low VDD voltage levels, resulting in a smaller read margin. However, precharging the tracking bit line 116 to the high power domain VDDM voltage level, the trip point of the tracking bit line 116 does not change with changes in the VDD voltage. In some examples, the memory bit lines 106 are precharged to the VDD voltage level.

After precharging the tracking bit line 116, during a read operation the tracking bit line 116 is discharged, and the trigger circuit 118 detects the voltage level of the tracking bit line 116. Once the voltage level of the tracking bit line 116 is pulled down below a trip point (e.g. half VDDM or VDDM/2), the trigger circuit 118 generates a trigger signal, based on which the SAE signal is output for enabling the corresponding sense amplifiers 122.

Figure 4:
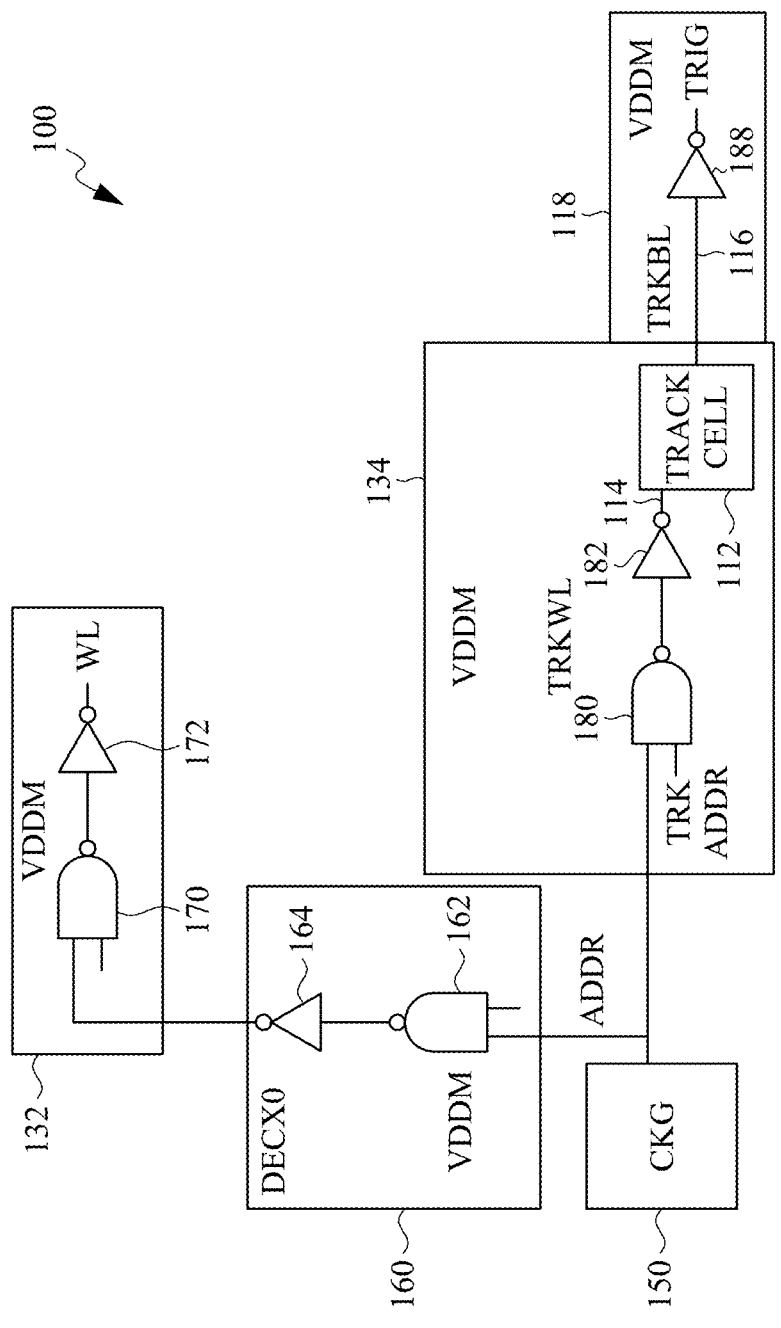
FIG. 4 is a block diagram illustrating further aspects of an example of the memory device illustrated in FIGS. 1 and 2 in accordance with some embodiments.

FIG. 4 illustrates further aspects of examples of the memory device 100. A clock generator 150 generates a clock signal CKG. In some implementations, the clock signal CKG is output at the VDD voltage level. The control circuitry 130 includes a word line decoder circuit 152 that receives the clock signal CKG. In the illustrated example the word line decoder circuit 160 includes a NAND gate 162 having one input that receives the clock signal CKG and a second input that receives an address signal ADDR. An inverter 164 receives the output of the NAND gate 162 and provides an output to the word line driver 132.

The word line decoder 160 operates in the high power domain in some examples. In other words, the word line decoder 160 provides an output at the VDDM level. In some examples, the inverter 164 has a power input terminal connected to receive the VDDM voltage, such as output by the level shifter 140, and thus provides its output signal in the high power domain (i.e. VDDM). In some examples, the inverter 164 and NAND gate each have a power input terminal connected to receive the VDDM voltage, such as output by the level shifter 140. In other embodiments, the inverter 164 and NAND gate 162 receive the VDD voltage at their power input terminals, and the output of the inverter is received by a level shifter to convert the output signal of the inverter 164 at the VDD level to the VDDM voltage level.

The word line driver circuit 132 receives a row address signal from the word line decoder circuit 160 and outputs a word line enable signal WL to the memory word line 108. In the illustrated example, the word line driver circuit 132 operates at the high power domain, thus providing the word line enable signal WL at the VDDM level. In the illustrated embodiment, the word line driver circuit 132 includes a NAND gate 170 having one input that receives the output of the word line decoder circuit 160, and provides an output to an inverter 172, which outputs the word line enable signal WL.

The tracking word line select circuit 134 also receives the clock signal CKG along with a tracking cell address TRK ADDR or a track enable signal. The tracking word line select circuit 134 outputs a tracking cell enable signal on the tracking word line 114. In the illustrated example, the tracking word line select circuit 134 includes a NAND gate 180 having one input that receives the clock signal CKG and a second input that receives the tracking cell address signal TRK ADDR. An inverter 182 receives the output of the NAND gate 180 and provides an output to the pass gate transistors 10*a*, 10*b* of the selected tracking cell 112 to connect the selected tracking cell 112 to its tracking bit line 106 (and 107).

In the illustrated example, the tracking word line select circuit 134 operates in the high power domain. In other words, the tracking word line select circuit 134 provides an output at the VDDM level. In some examples, the inverter 182 has a power input terminal connected to receive the VDDM voltage, such as output by the level shifter 140, and thus provides its output signal in the high power domain (i.e. VDDM). In some examples, the inverter 182 and NAND 180 gate each have a power input terminal connected to receive the VDDM voltage, such as output by the level shifter 140. In other embodiments, the inverter 182 and NAND gate 180 receive the VDD voltage at their power input terminals, and the output of the inverter 182 is received by a level shifter to convert the output signal of the inverter 182 at the VDD level to the VDDM voltage level.

The tracking bit line 116 is connected to the trigger circuit 118, which is also operated in the high power domain in some embodiments. As such, the trigger circuit 118 outputs the trigger circuit TRIG at the VDDM level. In some examples, the trigger circuit includes an inverter 188 connected to the tracking bit line 116, such that when the tracking signal on the tracking bit line 116 transitions to the trip point (i.e. towards a logic low level), the inverter 188 outputs a logic high trigger signal TRIG. In some implementations, the trigger signal TRIG functions as the SAE signal to enable the sense amplifiers 122 of the IO circuit 120. In other examples, additional logic circuit(s) receive the trigger signal TRIG and output the SAE signal. For instance, some embodiments employ delay circuits such as additional inverters to delay output of the SAE signal to achieve desired timing of a read operation.

In some examples, the trigger circuit 118 detects the voltage level of the tracking bit line 116 and compares the voltage level of the tracking bit line 116 to a reference voltage. Once the voltage level of the tracking bit line 116 is pulled down below the level of the reference voltage, the trigger circuit 118 generates the trigger signal TRIG.

Because the tracking bit line 116 is operated in the high power domain, the voltage change from VDDM to the trip-point is the same (i.e. half VDDM or VDDM/2), regardless of the VDD level. If the tracking bit line were operated at the lower VDD, which can vary between high VDD and low VDD levels, the voltage change from VDD to the trip point (e.g. half VDD or VDD/2), the SAE signal level would be smaller as compared to the clock signal CLK, resulting in a reduced read margin.

In the illustrated example, the trigger circuit 118 operates in the high power domain. In other words, the trigger circuit 118 provides the trigger signal TRIG at the VDDM level. In some examples, the inverter 188 has a power input terminal connected to receive the VDDM voltage, such as output by the level shifter 140, and thus provides the trigger signal TRIG in the high power domain (i.e. VDDM). In some examples, the inverter 188 has a power input terminal connected to receive the VDDM voltage, such as output by the level shifter 140. In other embodiments, the inverter receives the VDD voltage at its power input terminal, and the output of the inverter 188 is received by a level shifter to convert the trigger signal TRIG at the VDD level to the VDDM voltage level. Providing the trigger signal TRIG (i.e. SAE signal) at the VDDM level to the sense amplifiers 122 improves operation of the sense amplifiers, thus improving data read reliability. As noted above, periphery circuits such as the IO circuit 120 and sense amplifiers 122 thereof are connected to the VDD voltage level of the low power domain. As such, outputs of the sense amplifiers 122 are provided at the VDD voltage level. However, inputting the trigger signal TRIG (i.e. SAE signal) at enable terminals of the sense amplifiers 122 at the higher VDDM level insures threshold voltages of the sense amplifier transistors are exceeded.

Thus, data is read from memory cells 104 of the memory array 102 by the IO circuit 120 based on or in response to the trigger signal TRIG (SAE) output by the trigger circuit 118 to the sense amplifiers 122, and output by the sense amplifiers 122 at the low power domain VDD voltage level.

Figure 5:
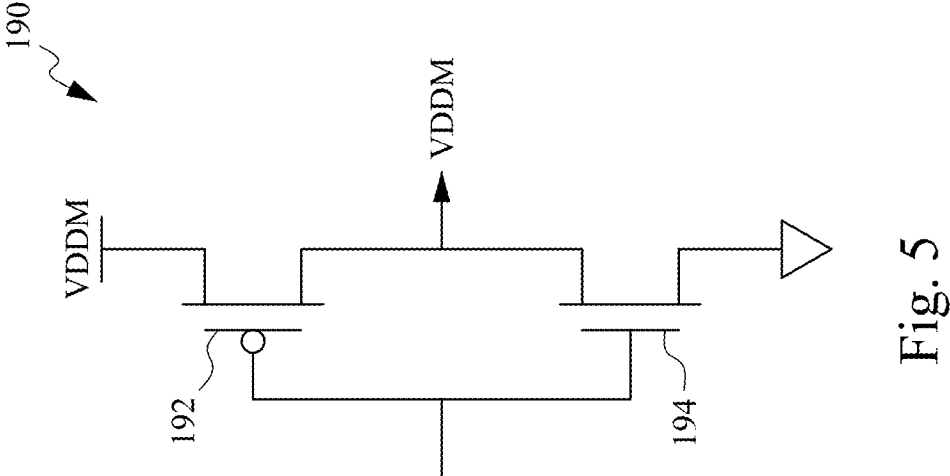
FIG. 5 is a schematic diagram illustrating an example of an inverter circuit in accordance with some embodiments.

FIG. 5 illustrates an example inverter circuit 190 used to implement one or more of the inverters 164, 172, 182, 188 of the word line decoder 160, word line driver 132, tracking word line select 134, and trigger circuit 118, respectively. The inverter circuit 190 includes a PMOS transistor 192 having one source/drain connected to the VDDM voltage level, a gate terminal and a second source/drain terminal connected to a source/drain terminal of an NMOS transistor 194. The other source/drain terminal of the NMOS transistor 194 is connected to ground. Thus, the inverter 190 provides a logic high output at the VDDM level. In other words, the inverter 190 operates in the high power domain.

Figure 6:
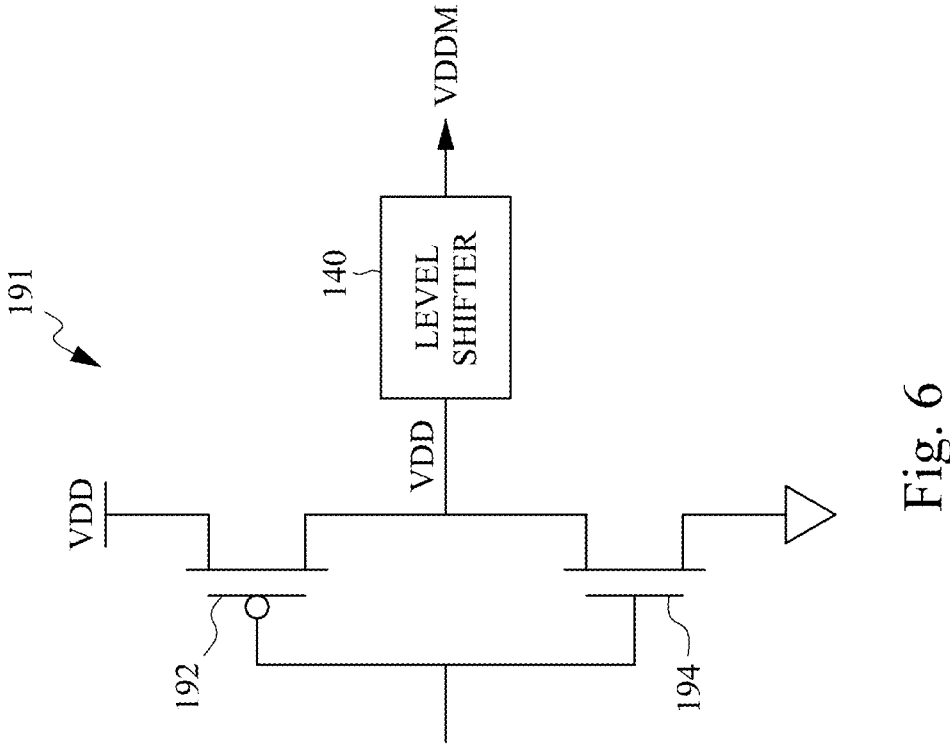
FIG. 6 is a schematic diagram illustrating another example of an inverter circuit in accordance with some embodiments.

FIG. 6 illustrates another example inverter circuit 191 used to implement one or more of the inverters 164, 172, 182, 188 of the word line decoder 160, word line driver 132, tracking word line select 134, and trigger circuit 118, respectively, in other examples. The PMOS transistor 192 and the NMOS transistor 194 of the inverter 191 shown in FIG. 6 are arranged as with the embodiment shown in FIG. 5, except the source/drain terminal of the PMOS transistor 192 is connected to the low power domain VDD voltage level and thus the inverter 191 provides a logic high output at the lower VDD level. The output of the inverter 191 of FIG. 6 is connected to a level shifter 140, and accordingly a logic high output is still provided at the VDDM voltage level. \

Figure 7:
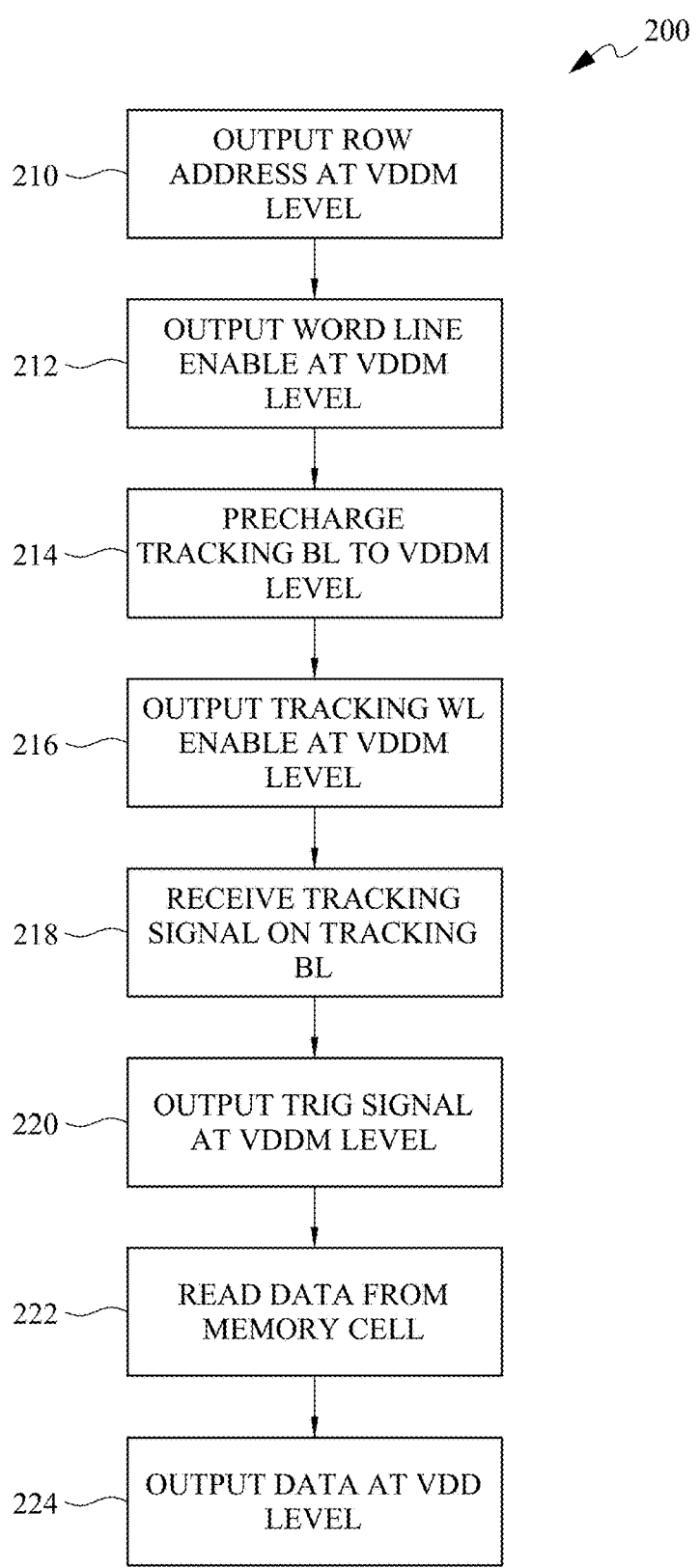
FIG. 7 is a flow diagram illustrating an example of a method in accordance with some embodiments.

FIG. 7 illustrates an example of a method of operating a memory device, such as the memory device 100 disclosed herein. In operation 210, a row address signal is output in a first or high power domain having a first voltage level (i.e. VDDM) by a word line decoder circuit 160 to a word line driver circuit 132. At an operation 212, a word line enable signal is output in the first power domain by the word line diver circuit 132 to a memory word line 108 connected to a memory cell 104 based on the row address signal. At an operation 214, a tracking bit line 116 connected to a tracking cell 112 is precharged to the first voltage level. A tracking cell enable signal is output in the first power domain to a tracking word line 114 connected to the tracking cell 112 at and operation 216. At an operation 218, a tracking signal is received on the tracking bit line 116 by a trigger circuit 118. A trigger signal TRIG in the first power domain is output by the trigger circuit 118 based on the tracking signal to an IO circuit 120 at an operation 220. Data from the memory cell 104 is read based on the trigger signal TRIG by the IO circuit 120 at an operation 222, and the data is output by the IO circuit in a second power domain having a second voltage level VDD lower than the first voltage level VDDM at an operation 224.

In some examples, a power signal having the first voltage level VDDM is provided to a power input terminals of one or more of an inverter 164 of the word line decoder circuit, an inverter 172 of the word line driver circuit 132, an inverter 182 of the tracking word line select circuit 134, and/or a power input terminal of an inverter 188 of the trigger circuit 118.

Examples of the memory device 100 disclosed herein thus demonstrate a small read margin gap associated with varying VDD voltage levels. A hybrid dual-rail memory arrangement operates the main memory array in the high power domain (i.e. VDDM). Additionally, tracking bit lines are precharged to the VDDM voltage level with a precharge transistor operated at the high power domain. The tracking array further outputs a trigger signal at the VDDM level based on the tracking bit line signal. Moreover, the word line decoder is operated at the high power domain to output the row address signal at the VDDM level.

Disclosed embodiments include a memory device that has a memory cell operated in a first power domain having a first voltage level. A memory word line is connected to the memory cell, and a memory bit line is connected to the memory cell. A word line decoder circuit may be operated in the first power domain, and a word line driver circuit is configured to receive a row address signal from the word line decoder circuit and output a word line enable signal to the memory word line. An IO circuit is connected to the memory bit line, and the IO circuit is operated in a second power domain having a second voltage level lower than the first voltage level. A tracking word line is connected to a tracking cell, and the tracking word line is configured to output a tracking cell enable signal in the first power domain. A tracking bit line is connected to the tracking cell, and the tracking bit line is configured to output a trigger signal to the IO circuit. The trigger signal may be in the first power domain.

In accordance with further disclosed embodiments, a memory device includes a memory array with a plurality of memory cells arranged in rows and columns. A word line decoder circuit has a first power input terminal, which may be configured to receive a first voltage level. An IO circuit is connected to the memory array and is configured to output data stored in the memory. The IO circuit includes a second power input terminal configured to receive a second voltage level lower than the first voltage level. A tracking cell has a tracking word line connected thereto, and the tracking word line is configured to output a tracking cell enable signal at the first voltage level. A tracking bit line is connected to the tracking cell, and a tracking bit line control circuit has a third power input terminal which may be configured to receive the first voltage level, and an output terminal configured to output a trigger signal at the first voltage level.

In accordance with still further disclosed embodiments, a method of operating a memory device includes outputting a row address signal by a word line decoder circuit to a word line driver circuit. The row address signal may be output in a first power domain having a first voltage level. A word line enable signal is output in the first power domain by the word line diver circuit to a memory word line connected to a memory cell based on the row address signal. A tracking cell bit line connected to a tracking cell is precharged to the first voltage level. A tracking cell enable signal is output in the first power domain to a tracking word line connected to the tracking cell. A tracking signal is received on the tracking bit line connected to the tracking cell by a trigger circuit, and a trigger signal is output in the first power domain by the trigger circuit based on the tracking signal to an IO circuit. Data from the memory cell is read based on the tracking signal by the IO circuit, and the data is output by the IO circuit in a second power domain having a second voltage level lower than the first voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory cell operated in a first power domain having a first voltage level;
a memory word line connected to the memory cell;
a memory bit line connected to the memory cell;
a word line decoder circuit operated in the first power domain;
a word line driver circuit configured to receive a row address signal from the word line decoder circuit and output a word line enable signal to the memory word line;
an IO circuit connected to the memory bit line, the IO circuit operated in a second power domain having a second voltage level lower than the first voltage level;
a tracking cell;
a tracking word line connected to the tracking cell, the tracking word line configured to output a tracking cell enable signal in the first power domain;
a tracking bit line connected to the tracking cell, the tracking bit line configured to output a trigger signal to the IO circuit;
a tracking bit line precharge circuit operated in the first power domain comprising a precharge transistor having a first source/drain terminal configured to receive the first voltage level, a gate terminal configured to receive a precharge signal, and a second source/drain terminal connected to the tracking bit line to selectively precharge the tracking bit line to the first voltage level in response to the precharge signal, and wherein the tracking bit line is configured to output the trigger signal in the first power domain;

a clock generator configured to output a clock signal at the second voltage level;
a tracking word line select circuit comprising:
a first NAND gate configured to receive the clock signal and a tracking cell address signal, and
a first inverter configured to receive an output from the first NAND gate and output the tracking cell enable signal;
a trigger circuit comprising a second inverter configured to receive a tracking signal and output the trigger signal;
wherein the word line decoder circuit comprises:
a second NAND gate configured to receive the clock signal and the row address signal, and
a third inverter configured to receive an output from the second NAND gate and output the row address signal; and
wherein the word line driver circuit comprises:
a third NAND gate configured to receive the row address signal from the third inverter, and
a fourth inverter configured to receive an output from the third NAND gate and output the word line enable signal.

2. The memory device of claim 1, wherein:
the first source/drain terminal is configured to receive the second voltage level; and
the tracking bit line precharge circuit further comprises a level shifter having an input terminal connected to the second source/drain terminal and an output terminal connected to the tracking bit line, wherein the tracking bit line precharge circuit is configured to use the level shifter to selectively precharge the tracking bit line to the first voltage level in response to the precharge signal.

3. The memory device of claim 1, wherein the memory cell and the tracking cell are each an SRAM cell.

4. The memory device of claim 1, wherein the IO circuit includes a sense amplifier operated in the second power domain.

5. The memory device of claim 1, wherein the memory bit line is configured to be precharged to the second voltage level.

6. The memory device of claim 1, wherein the word line decoder circuit includes an inverter circuit having a power input terminal configured to receive the first voltage level.

7. The memory device of claim 1, wherein the word line decoder circuit includes:
an inverter circuit having a power input terminal configured to receive the second voltage level, and an output terminal configured to output the word line enable signal in the second power domain; and
a level shifter having an input terminal connected to the output terminal of the inverter circuit, and an output terminal connected to the word line driver circuit, wherein the word line decoder circuit is configured to use the inverter circuit and the level shifter to provide an output at the first voltage level to the word line driver circuit.

8. The memory device of claim 1, further comprising a tracking bit line control circuit including an inverter circuit having a power input terminal configured to receive the first voltage level.

9. The memory device of claim 1, further comprising a tracking bit line control circuit including:
an inverter circuit having a power input terminal configured to receive the second voltage level, and an output terminal configured to output the trigger signal in the second power domain; and a level shifter having an input terminal connected to the output terminal of the inverter circuit, and an output terminal configured to provide the trigger signal at the first voltage level.

10. The memory device of claim 1, wherein the first NAND gate, the first inverter, the second inverter, the second NAND gate, the third inverter, the third NAND gate, and the fourth inverter are configured to receive the first voltage level.

11. A memory device, comprising:

a memory array including a plurality of memory cells arranged in rows and columns;

a word line decoder circuit including a first power input terminal;

an IO circuit connected to the memory array and configured to output data stored in the memory array, the IO circuit including a second power input terminal configured to receive a second voltage level lower than a first voltage level;

a tracking cell;

a tracking word line connected to the tracking cell, the tracking word line configured to output a tracking cell enable signal at the first voltage level;

a tracking bit line connected to the tracking cell;

a tracking bit line control circuit including a third power input terminal configured to receive the first voltage level, and an output terminal configured to output a trigger signal at the first voltage level;

a tracking bit line precharge circuit comprising a precharge transistor having a first source/drain terminal configured to receive the first voltage level, a gate terminal configured to receive a precharge signal, and a second source/drain terminal connected to the tracking bit line to selectively precharge the tracking bit line to the first voltage level in response to the precharge signal;

a clock generator configured to output a clock signal at the second voltage level;

a tracking word line select circuit comprising:

a first NAND gate configured to receive the clock signal and a tracking cell address signal, and a first inverter configured to receive an output from the first NAND gate and output the tracking cell enable signal;

a trigger circuit comprising a second inverter configured to receive a tracking signal and output the trigger signal;

wherein the word line decoder circuit comprises:

a second NAND gate configured to receive the clock signal and a row address signal, and a third inverter configured to receive an output from the second NAND gate and output the row address signal; and a word line driver circuit comprising:

a third NAND gate configured to receive the row address signal from the third inverter, and a fourth inverter configured to receive an output from the third NAND gate and output a word line enable signal.

12. The memory device of claim 11, wherein the plurality of memory cells and the tracking cell are SRAM cells.

13. The memory device of claim 11, wherein the IO circuit includes a plurality of sense amplifiers.

14. The memory device of claim 11, wherein the word line decoder circuit includes an inverter circuit having a power input terminal configured to receive the first voltage level, and wherein the first power input terminal is configured to receive the first voltage level.

15. The memory device of claim 11, wherein the tracking bit line control circuit includes an inverter circuit having the third power input terminal.

16. The memory device of claim 11, wherein the first NAND gate, the first inverter, the second inverter, the second NAND gate, the third inverter, the third NAND gate, and the fourth inverter are configured to receive the first voltage level.

17. A method of operating a memory device, comprising:

outputting a clock signal by a clock generator at a second voltage level lower than a first voltage level of a first power domain to a word line decoder circuit and a tracking word line select circuit, wherein the tracking word line select circuit comprises:

a first NAND gate configured to receive the clock signal and a tracking cell address signal, and a first inverter configured to receive an output from the first NAND gate and output a tracking cell enable signal;

outputting a row address signal by the word line decoder circuit to a word line driver circuit, wherein the word line decoder circuit comprises:

a second NAND gate configured to receive the clock signal and the row address signal, and a second inverter configured to receive an output from the second NAND gate and output the row address signal;

outputting a word line enable signal in the first power domain by the word line driver circuit to a memory word line connected to a memory cell based on the row address signal, wherein the word line driver circuit comprises:

a third NAND gate configured to receive the row address signal from the second inverter, and a third inverter configured to receive an output from the third NAND gate and output the word line enable signal;

precharging a tracking bit line connected to a tracking cell to the first voltage level by a tracking bit line precharge circuit operated in the first power domain comprising a precharge transistor having a first source/drain terminal configured to receive the first voltage level, a gate terminal configured to receive a precharge signal, and a second source/drain terminal connected to the tracking bit line to selectively precharge the tracking bit line to the first voltage level in response to the precharge signal;

outputting the tracking cell enable signal in the first power domain to a tracking word line connected to the tracking cell;

receiving a tracking signal on the tracking bit line connected to the tracking cell by a trigger circuit comprising a fourth inverter configured to receive the tracking signal and output a trigger signal;

outputting the trigger signal in the first power domain by the trigger circuit based on the tracking signal to an IO circuit;

reading data from the memory cell based on the tracking signal by the IO circuit; and outputting the data by the IO circuit in a second power domain having the second voltage level.

18. The method of claim 17, further comprising supplying a power signal having the first voltage level to a power input terminal of an inverter of the word line decoder circuit, wherein the word line decoder circuit outputs the row address signal in the first power domain.

19. The method of claim 17, further comprising supplying a power signal having the first voltage level to a power input terminal of an inverter of the trigger circuit.

20. The method of claim 17, wherein the first NAND gate, the first inverter, the second inverter, the second NAND gate, the third inverter, the third NAND gate, and the fourth inverter are configured to receive the first voltage level.

* * * * *